(12) United States Patent
Zhang

(10) Patent No.: US 9,368,183 B2
(45) Date of Patent: Jun. 14, 2016

(54) METHOD FOR FORMING AN INTEGRATED CIRCUIT PACKAGE

(71) Applicant: NVIDIA CORPORATION, Santa Clara, CA (US)

(72) Inventor: Leilei Zhang, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 339 days.

(21) Appl. No.: 13/938,117

(22) Filed: Jul. 9, 2013

(65) Prior Publication Data

US 2015/0016042 A1  Jan. 15, 2015

(51) Int. Cl.
| | |
|---|---|
| *H01L 21/445* | (2006.01) |
| *G11C 11/34* | (2006.01) |
| *H05K 3/24* | (2006.01) |
| *H01L 21/48* | (2006.01) |
| *H05K 3/06* | (2006.01) |

(52) U.S. Cl.
CPC ............. *G11C 11/34* (2013.01); *H01L 21/48* (2013.01); *H05K 3/242* (2013.01); *H01L 2224/16225* (2013.01); *H01L 2924/12044* (2013.01); *H01L 2924/15311* (2013.01); *H05K 3/067* (2013.01); *H05K 2203/175* (2013.01)

(58) Field of Classification Search
CPC ..... H01L 21/44; H01L 21/441; H01L 21/445; H01L 21/48; H01L 2224/16225; H01L 2924/15311; H01L 2924/12044; G11C 11/34; H05K 3/067; H05K 3/242; H05K 2203/175
See application file for complete search history.

(56) References Cited

U.S. PATENT DOCUMENTS

| | | | |
|---|---|---|---|
| 6,376,052 B1 * | 4/2002 | Asai et al. | 428/209 |
| 6,649,506 B2 * | 11/2003 | Hsu | 438/612 |
| 7,208,349 B2 * | 4/2007 | Lee et al. | 438/125 |

* cited by examiner

*Primary Examiner* — Carl Arbes
(74) *Attorney, Agent, or Firm* — Artegis Law Group, LLP

(57) ABSTRACT

An integrated circuit package includes a packaging substrate with an electrical connection pad formed thereon and an integrated circuit die coupled to the electrical connection pad. The electrical connection pad includes an electroplated surface finish layer, but does not include an electrical trace configured as a plating tail. Because the electrical connection pad is free of a plating tail, signal degradation caused by the presence of plating tails in the integrated circuit package is avoided.

10 Claims, 12 Drawing Sheets

METHOD FOR FORMING AN INTEGRATED CIRCUIT PACKAGE

BACKGROUND OF THE INVENTION

1. Field of the Invention

Embodiments of the present invention relate generally to integrated circuit chip packaging and, more specifically, to a packaging substrate that has electroplated pads that are free of plating tails.

2. Description of the Related Art

In the packaging of integrated circuit (IC) chips, an IC chip is typically mounted on a packaging substrate to facilitate electrical connection of the chip to a motherboard or other printed circuit board (PCB). The connection between the IC chip and the packaging substrate can be a plurality of solder joints, such as reflowed solder balls or solder micro-bumps, which are solder bumps deposited on surface pads of the IC chip. In order to provide a robust electrical connection between such a solder joint and a packaging substrate, it is generally desirable for the surface contacting the solder to be oxide-free. In package-on-package (PoP) design, in which one packaging substrate is electrically coupled to another packaging substrate, this is especially true, since the solder joints between the two packaging substrates may undergo multiple reflow (melting and solidification) processes.

Because the electrical connection pads formed on packaging substrates commonly include copper or a copper alloy, an oxidation layer can form on a pad surface before a solder joint is coupled to the pad. This layer of oxidized copper reduces the reliability of the solder joint formed on the pad surface and is therefore undesirable, particularly for solder joints coupling one packaging substrate to another in a package-on-package design. Consequently, a non-oxidizing surface finish is commonly deposited on electrical connection pads to prevent such oxidation, for example a layer of nickel-gold plating. Because such non-oxidizing surface finishes are deposited via an electroplating process, plating tails are necessarily formed on a surface of a packaging substrate prior to the electroplating process.

A plating tail is a conductive path or trace formed between a surface receiving the electroplated surface finish, such as an electrical connection pad, and a suitable connection point for an electrode. For example, plating tails are commonly routed to an easily accessible edge region of a packaging substrate to facilitate electrical coupling of the plating tails to an electrode during the electroplating process. Thus, for a packaging substrate that includes a large number of electrical connection pads to be plated with a non-oxidizing surface finish, a plurality of plating tails may be formed across an extensive area of the packaging substrate. In high-frequency circuits, the presence of such plating tails can degrade signal integrity in the circuit by increasing signal noise. For example, input signals to or output signals from an IC chip can reflect off the end of a plating tail or a step in a plating tail, thereby interfering with these signals and the proper operation of the IC.

As the foregoing illustrates, there is a need in the art for a packaging substrate that has electroplated pads that are free of plating tails.

SUMMARY OF THE INVENTION

One embodiment of the present invention sets forth a method for forming an integrated circuit package. The method includes depositing an electrically conductive seed layer on a packaging substrate, wherein the seed layer includes a plating tail portion and a pad portion that is in electrical communication with the plating tail portion. The method further includes depositing a mask layer on the packaging substrate to cover the plating tail portion while leaving the pad portion exposed, after depositing the mask layer, performing an electro-plating process on the packaging substrate to deposit a metallic layer on the pad portion, and, after performing the electro-plating process, removing the mask layer and the plating tail portion.

One advantage of the disclosed technique is that a packaging substrate can be formed with electrical connection pads that have a reliable, electroplated surface finish but without the unwanted artifact of plating tails used to produce the electroplated surface finish. Because such a packaging substrate is free of plating tails, signals to and from integrated circuit chips coupled to the packaging substrate have improved signal integrity, which can significantly improve performance of the integrated circuit chips.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
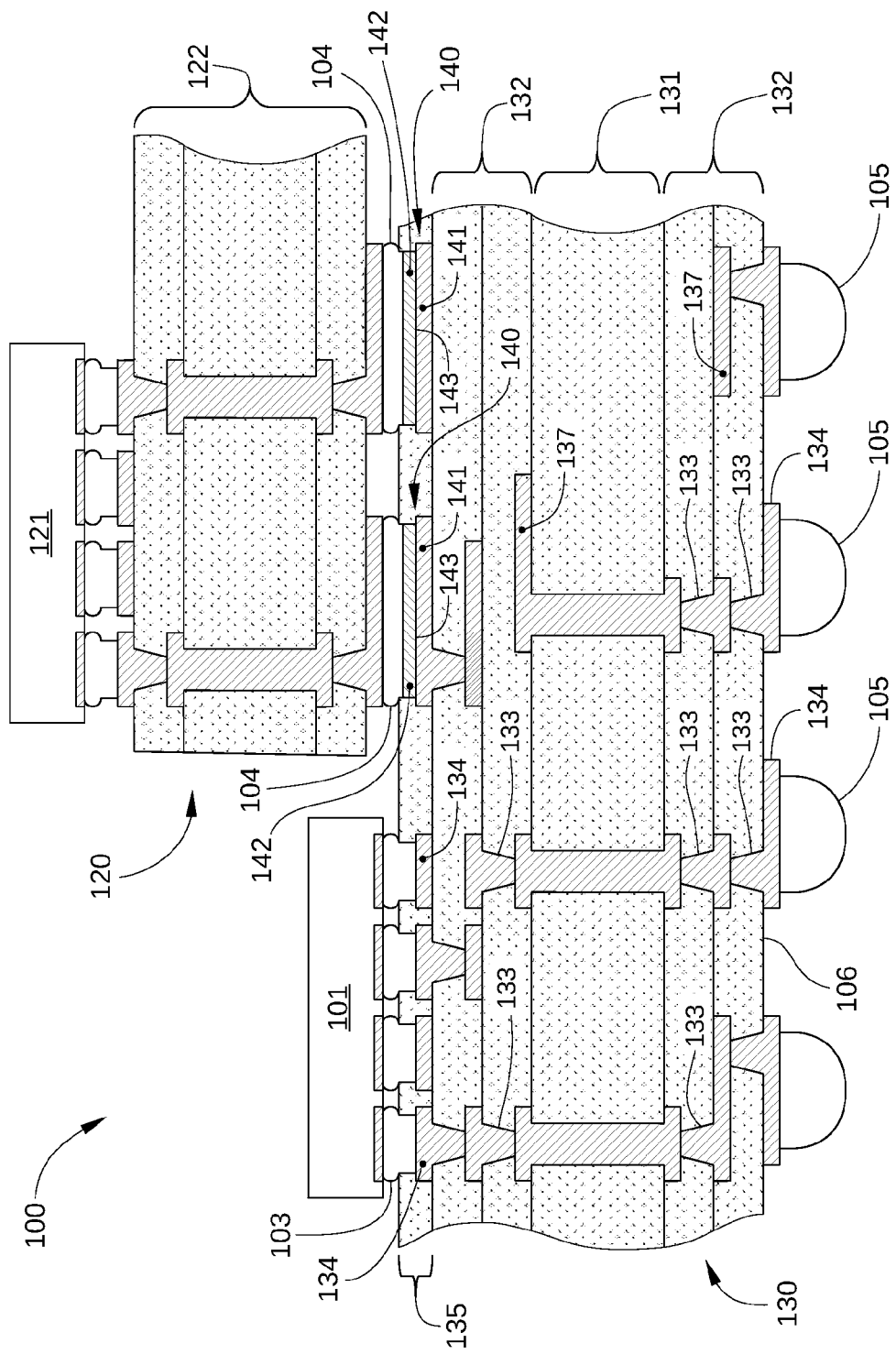
FIG. 1 is a schematic cross-sectional view of an integrated circuit (IC) package, configured according to one embodiment of the present invention.

FIG. 1 is a schematic cross-sectional view of an integrated circuit (IC) package 100, according to one embodiment of the present invention. IC package 100 may include one or more IC chips 101 and a second IC package 120, each coupled to a packaging substrate 130. IC package 100 is configured to electrically and mechanically connect IC chip 101, second IC package 120, and any other logic or memory ICs coupled to second IC package 120 or packaging substrate 130 to a printed circuit board or other mounting substrate (not shown) external to IC package 100. In addition, IC package 100 protects IC chip 101 and second IC package 120 from ambient moisture, contamination, and mechanical shock and stress. Second IC package 120 may include an IC chip 121, as shown, as well as one or more additional IC chips. IC package 100 may also include a protective over-molding formed over IC chips 101 and second IC package 120. For clarity, over-molding in IC package 100 is not shown in FIG. 1.

In the embodiment illustrated in FIG. 1, IC package 100 includes one or more discrete IC packages, e.g., second IC package 120, and therefore may be fabricated using the so-called "package-on-package," or PoP method. In the PoP method, two or more IC packages are stacked or otherwise installed atop each other, typically using a standard interface for routing signals therebetween. This configuration allows higher component density in computing devices, such as mobile phones, personal digital assistants (PDA), electronic tablets, digital cameras, and the like.

IC package 100 configuration may include a pure memory-stacking PoP configuration, in which two or more memory only packages are stacked on each other to form IC package 100. Alternatively, IC package 100 may include a mixed logic-memory stacking PoP configuration, in which a logic or central-processing unit (CPU) package, such as an application processor for a mobile phone, is stacked with a memory package. In one such embodiment, the logic package is configured to be disposed between the memory package and the printed circuit board or other mounting substrate external to IC package 100, since the logic package generally includes many more electrical connections to the mounting substrate than the memory package. For example, in the embodiment illustrated in FIG. 1, packaging substrate 130 and IC chip 101 are disposed between second IC package 120 and a printed circuit board that is not shown.

Each of IC chips 101 and 121 may be a semiconductor die singulated from a separately processed semiconductor substrate, such as a CPU, a graphics processing unit (GPU), an application processor or other logic device, a memory chip, a global positioning system (GPS) chip, a radio frequency (RF) transceiver chip, a Wi-Fi chip, a system-on-chip, or any other semiconductor chip that is suitable for mounting on packaging substrate 130 or for being included in second IC package 120. Thus, IC chips 101 and 121 may include any IC chips that may benefit from being assembled together in a single microelectronic package. Moreover, in FIG. 1, IC package 100 is shown with two IC chips, but in other embodiments IC package 100 may be configured with more or fewer IC chips. In some embodiments, IC package 100 and/or second IC package 120 may be configured as a system-on-chip and may include a heterogeneous assortment of IC chips.

IC chip 101 may be coupled to packaging substrate 130 using solder microbumps 103 or any other technically feasible approach, and in some embodiments an underfill material is used to protect the electrical connections coupling IC chip 101 and packaging substrate 130. For clarity, no underfill material is illustrated in FIG. 1. IC chip 121 may be coupled to second IC package 120 in a fashion similar to that described for IC chip 101 to packaging substrate 130.

Packaging substrate 130 provides IC package 100 with structural rigidity as well as an electrical interface for routing input and output signals and power between IC chip 101, second IC package 120, and an underlying support structure external to IC package 100, such as a printed circuit board. Packaging substrate 130 may include a core board 131 and multiple build-up layers 132 on each side of core board 131. Packaging substrate 130 also includes via structures 133, disposed in core board 131 and build-up layers 132, and interconnect lines 137. Together, via structures 133 and interconnect lines 137 are configured to route power, ground, and/or input/output signals between IC chip 101, second IC package 120, and a printed circuit board or other mounting substrate external to IC package 100. Packaging substrate 130 may also include a dielectric layer 135 that is formed as an insulative layer on one or more surfaces of packaging substrate 130. Second IC package 120 may include a packaging substrate 122 substantially similar in configuration to packaging substrate 130 that includes a core board, one or more build-up layers, via structures, interconnect layers, and the like.

Micro-bumps 103 or other technically feasible chip package electrical connections may be used to electrically couple IC chip 101 and packaging substrate 130, and one or more solder balls 104 or other technically feasible chip package electrical connections may be used to electrically couple second IC package 120 and packaging substrate 130. In addition, a plurality of solder balls 105 or other chip package electrical connections may be arrayed on a PCB mounting surface 106 to facilitate electrical coupling of IC package 100 to a printed circuit board or other mounting substrate external to IC package 100. Micro-bumps 103 and solder balls 105 are formed on electrical connection pads 134 of packaging substrate 130, and solder balls 104 are formed on or coupled to electrical connection pads 140 of packaging substrate 130. In the embodiment illustrated in FIG. 1, second IC package 120 is electrically coupled to electrical connection pads 140, but in other embodiments, an unpackaged, or "bare," IC chip may be electrically coupled to one or more of electrical connection pads 140.

According to some embodiments of the present invention, electrical connection pads 140 are each configured with a bulk portion 141 and an electroplated surface finish layer 142. Bulk portion 141 may include the same conductive materials as interconnect lines 137, e.g., copper, and may be formed in the same fashion as interconnect lines 137, such as an electroplating process. Electroplated surface finish 142 includes an electrically conductive material that is substantially inert with respect to oxygen, and therefore little or no oxide forms on surface 143 of bulk portion 141 after bulk portion 141 is deposited. Consequently, a more robust solder joint can be formed between packaging substrate 130 and second IC package 120 that is free of an oxide-interface layer. Because solder joints between the two packaging substrates may undergo multiple reflow (melting and solidification) processes in an IC package with a PoP configuration, more robust solder joints result in more reliable electrical connections in IC package 100. Electrically conductive materials suitable for use in electroplated surface finish later 142 include an organic solderability preservative (OSP) material, a nickel-gold (Ni—Au) material, a nickel-silver (Ni—Ag) material, a nickel-platinum (Ni—Pt) material, a nickel-containing material, a gold-containing material, and/or a platinum-containing material. OSP includes a water-based organic compound that selectively bonds to copper and provides an organometallic layer that protects the copper from oxidation prior to and during soldering processes.

Electroplated surface finish 142 is formed using an electroplating process, in which an electrical bias is applied to bulk portion 141 of each electrical connection pad 140 to be electroplated. Simultaneously, surface 143 of each electrical connection pad 140 to be electroplated is exposed to an electrolyte solution containing a material or materials to be plated onto surface 143. Because dielectric layer 135 is configured to electrically isolate each electrical connection pad 140 from each and from other electrically conductive structures on the surface of packaging substrate 130, such as electrical connection pads 134, each surface 143 to be plated is generally coupled to a plating tail or other conductive trace, where each conductive trace provides a conductive path between one or more surfaces 143 and a suitable connection point for an electrode to apply an electrical bias. As noted above, the presence of such plating tails can degrade signal integrity in IC package 100 by increasing signal noise. According to embodiments of the present invention, electroplated surface finish 142 is formed using an electroplating process on each of electrical connection pads 140, but electrical connection pads 140 are free of such plating tails when the fabrication of IC package 100 is completed.

Figure 2:
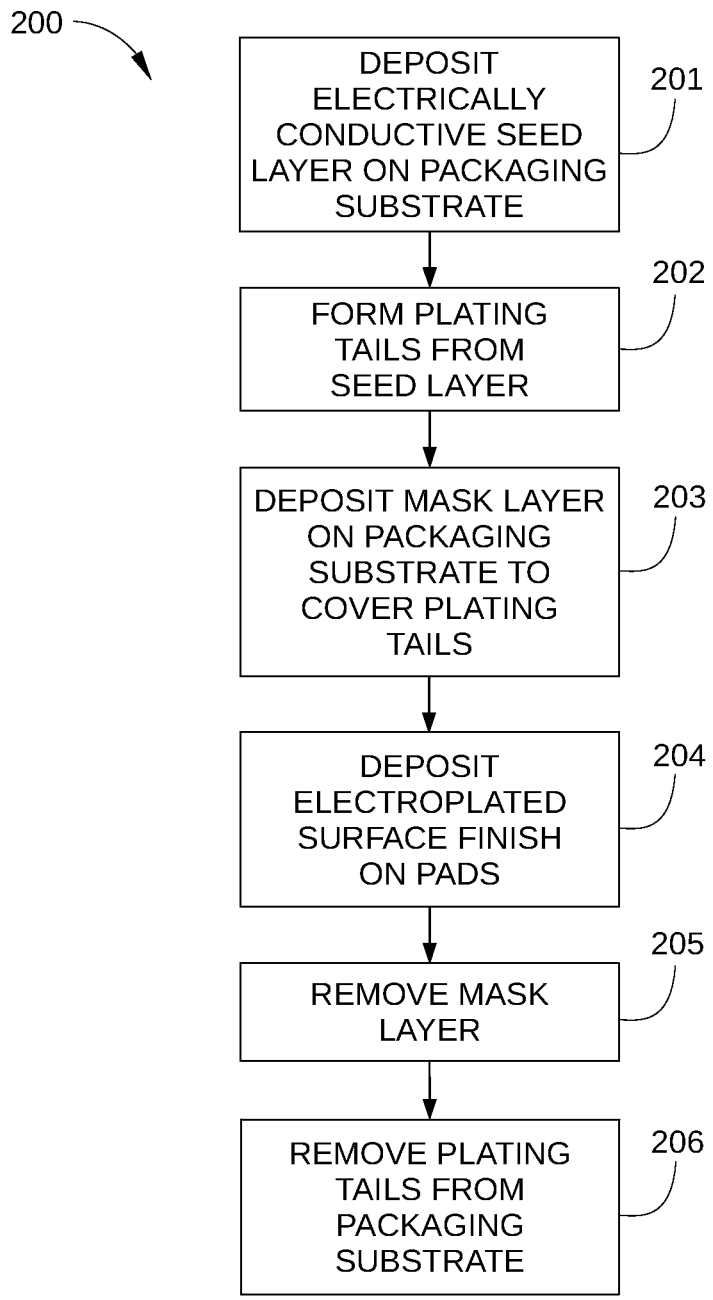
FIG. 2 sets forth a flowchart of method steps for forming an IC chip package that has electroplated connection pads that are free of plating tails, according to one embodiment of the present invention.

FIG. 2 sets forth a flowchart of method steps for forming an IC chip package that has electroplated connection pads that are free of plating tails, according to one embodiment of the present invention. Although the method steps are described with respect to IC package 100 of FIG. 1, persons skilled in the art will understand that performing the method steps, in any order, to form an IC chip package is within the scope of the present invention. FIGS. 3A-3G sequentially illustrate the results of the different steps 201-206 of FIG. 2.

Figure 3A:
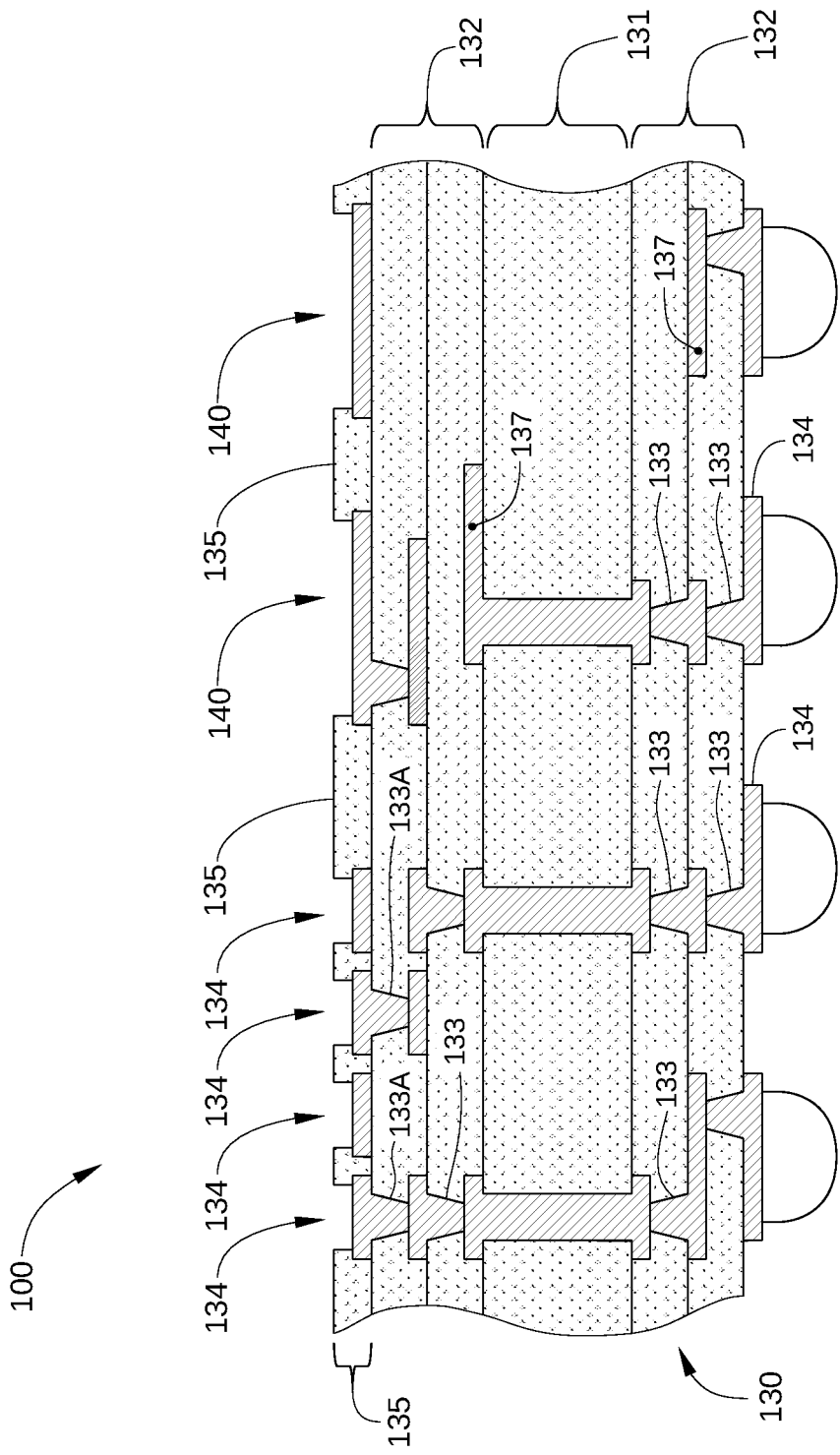
FIGS. 3A-3G sequentially illustrate the results of the different method steps of FIG. 2, according to various embodiments of the present invention.

Prior to effecting a method 200, packaging substrate 130, as shown in FIG. 3A, is formed using any technically feasible fabrication processes. For example, one or more build-up layers 132 are formed on each side of core board 131, and via structures 133 and interconnect lines 137 may be progressively formed on core board 131 and each of the successive build-up layers 132 as the build-up layers 132 are added to packaging substrate 130. Typically, copper electroplating, patterning, and etching processes are used to form electrically conductive structures in packaging substrate 130, such as via structures 133, interconnect lines 137, electrical connection pads 134, and electrical connection pads 140. In some embodiments, the electrically conductive structures formed in or on a particular build-up layer 132 are formed in a single cycle of copper electroplating, patterning, and etching processes. For example, via structures 133A, electrical connection pads 134, and electrical connection pads 140 can be formed in a single copper electroplating, a single patterning process, and a single copper-etching process. Alternatively, any other technically feasible deposition processes and/or patterning and etching processes may be used to form electrically conductive structures included in packaging substrate 130 without exceeding the scope of the present invention, such as metal vapor deposition, sputter deposition, chemical vapor deposition, and the like. Dielectric layer 135 is then formed on packaging substrate 130 as an electrically insulating layer that is patterned and etched using conventional processes to isolate and protect conductive structures formed on the surface of packaging substrate 130.

Figure 3B:
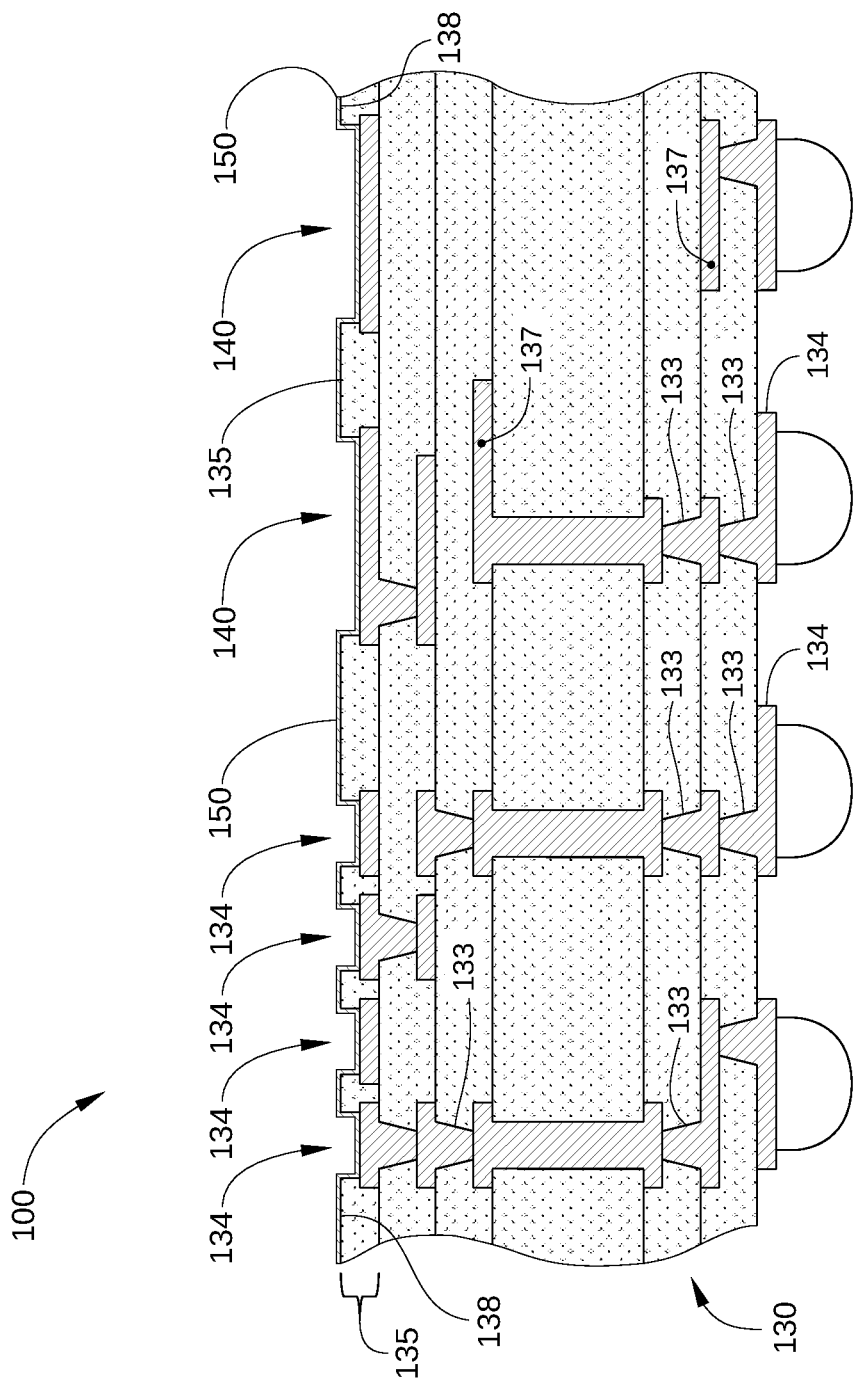

As shown in FIG. 2, the method 200 begins at step 201, where an electrically conductive seed layer 150 is deposited on top surface 138 of packaging substrate 130, as shown in FIG. 3B. In the embodiment illustrated in FIG. 3B, top surface 138 includes exposed surfaces of dielectric layer 135, electrical connection pads 134, and electrical connection pads 140, and seed layer 150 is deposited on each of these exposed surfaces. Plating tails 151 (shown in FIGS. 3C and 4), which are are formed from seed layer 150, are configured to apply an electrical bias to electrical connection pads 140, and therefore can be configured for conducting low current levels. Consequently, in some embodiments, seed layer 150 is a relatively thin layer of conductive material compared to the dimensions of other electrically conductive structures of packaging substrate 130, such as via structures 133, interconnect lines 137, electrical connection pads 134, and electrical connection pads 140. For example, seed layer 150 may be on the order of a few microns, whereas the thickness of interconnect lines 137, electrical connection pads 134, and electrical connection pads 140 may be on the order of 5 to 10 microns or more.

Seed layer 150 may include any material suitable for use as an electro-plating seed layer, such as copper (Cu), aluminum (Al), a copper-aluminum alloy, etc., and may be deposited via electroless plating, metal vapor deposition, sputter deposition, chemical vapor deposition, and the like. In some embodiments, an oxide removal process, such as a wet-etch process, may be performed on packaging substrate 130 prior to the deposition of seed layer 150 on packaging substrate 130, so that little or no oxide is present between seed layer 150 and electrical connection pads 140.

Figure 3C:
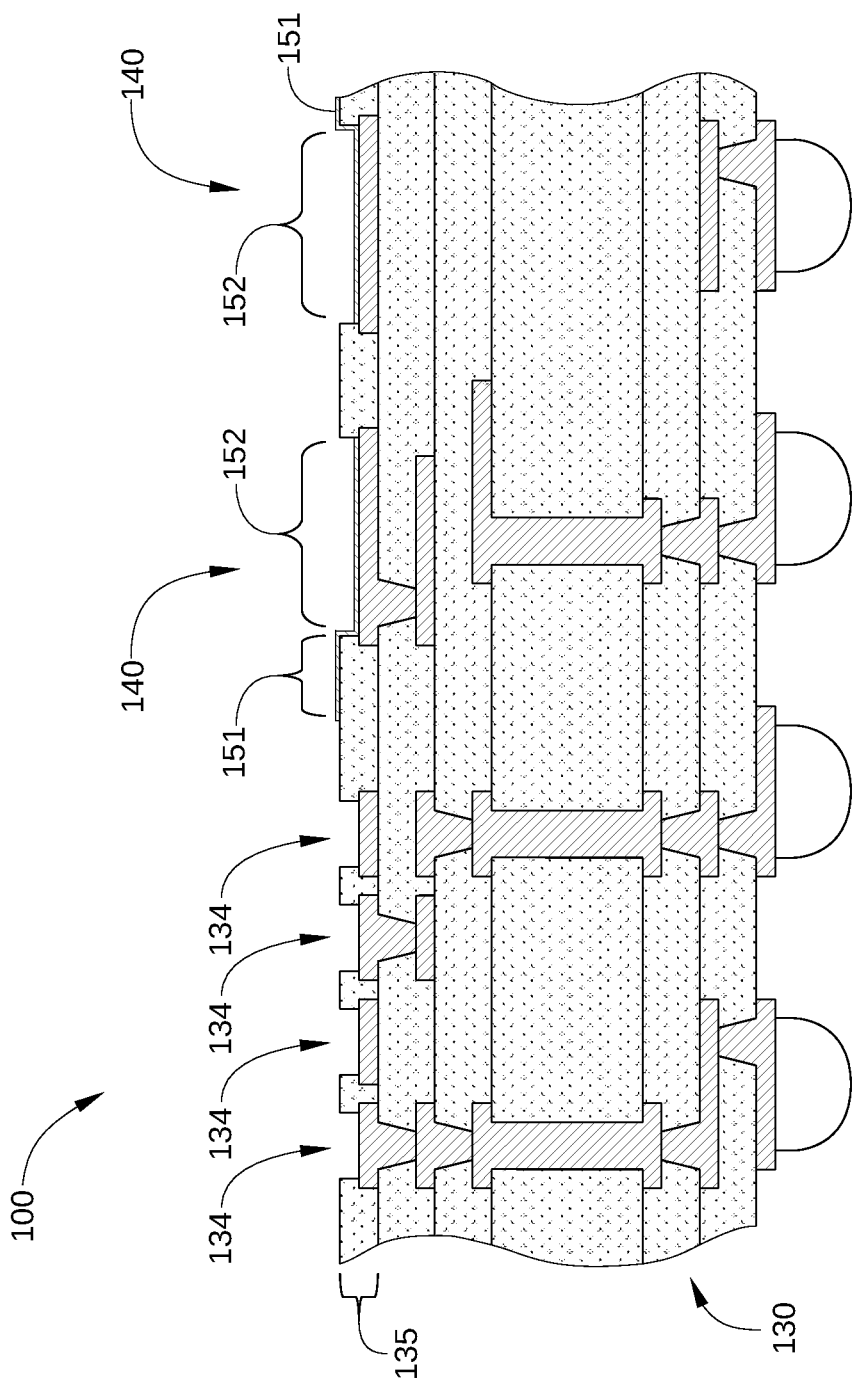

In step 202, plating tails 151 and plating pads 152 are formed on packaging substrate 130 from seed layer 150, as shown in FIG. 3C. Specifically, plating pads 152 are formed on electrical connection pads 140, but not on electrical connection pads 134, since electrical connection pads 134 are not configured to include an electroplated surface finish layer. Standard masking and metal etching processes may be used to form plating tails 151 and plating pads 152. For example, when seed layer 150 includes copper, a mask layer can be deposited on seed layer 150, such as dry-film photoresist layer, and selectively exposing portions of the photoresist layer to an energy source to selectively remove portions of the mask layer. Packaging substrate 130 can then be exposed to a wet etching solution selected to etch exposed copper, thereby removing unwanted portions of seed layer 150 and forming plating tails 151 and plating pads 152.

Figure 4:
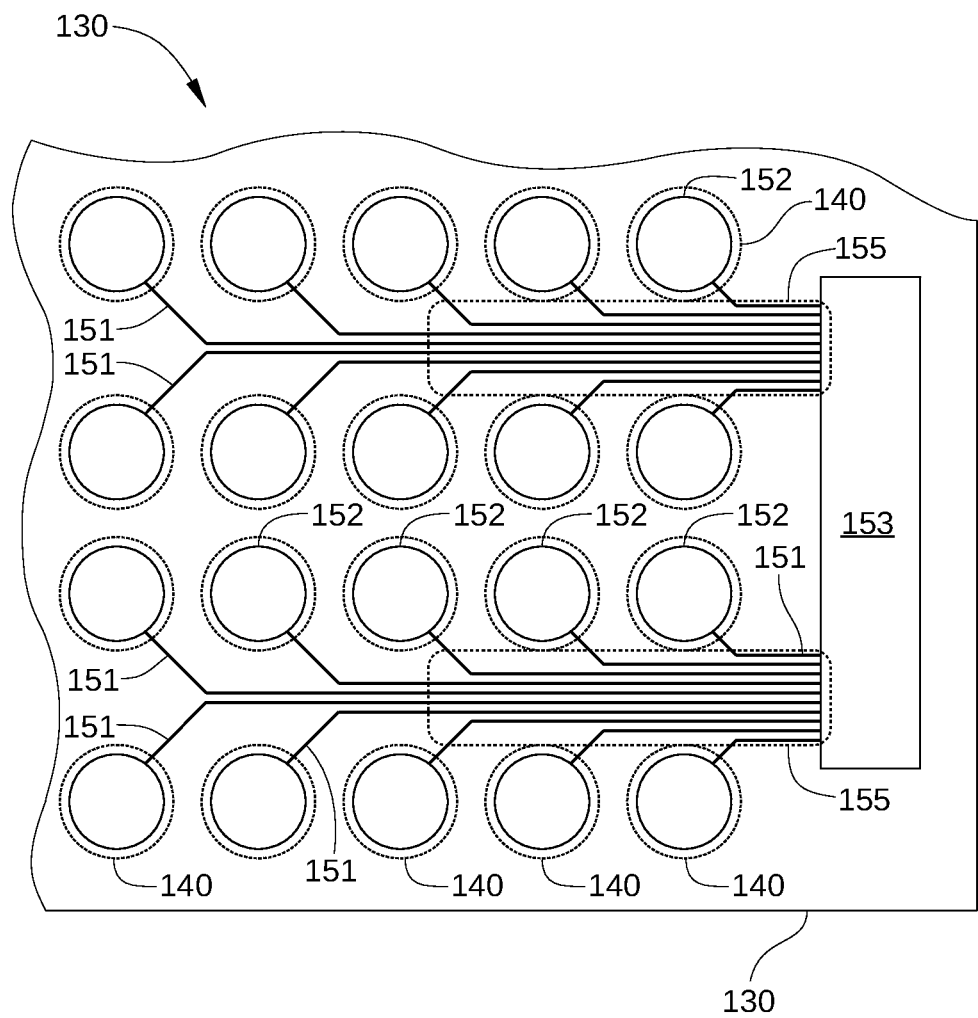
FIG. 4 is a partial plan view of a packaging substrate after plating tails and plating pads are formed from a seed layer, according to one embodiment of the present invention.

FIG. 4 is a partial plan view of packaging substrate 130 after plating tails 151 and plating pads 152 are formed from seed layer 150, according to one embodiment of the present invention. Each of plating pads 152 is in electrical communication with at least one of plating tails 151, so that an electrical bias can be applied to the plating pad, thereby facilitating the formation of electroplated surface finish layer 142 thereon in a subsequent step of method 200. As shown, when packaging substrate includes a relatively large number of electrical connection pads 140, plating tails 151 and plating pads 152 are formed across extensive areas 155 of packaging substrate 130 in order to provide a conductive path between each of electrical connection pads 140 and connection points 153. Connection points 153 are contact pads formed on dielectric layer 135 that are configured for the placement of an electrode as part of the electroplating process. Connection points 153 are typically formed at convenient, easily accessible locations for an electrode to contact, such as near the periphery of packaging substrate 130.

In the embodiment illustrated in FIGS. 3B and 3C, seed layer 150 is deposited as a blanket film in step 201, and portions thereof are selectively removed to form plating tails 151 and plating pads 152 in step 202. In other embodiments, plating tails 151 and plating pads 152 may be formed by first masking top surface 138 of packaging substrate 130, then selectively depositing seed layer 150 onto packaging substrate 130. Moreover, any other technically feasible fabrication processes may be used to form plating tails 151 and plating pads 152 on packaging substrate 130 as illustrated in FIG. 3C without exceeding the scope of the present invention.

Figure 3D:
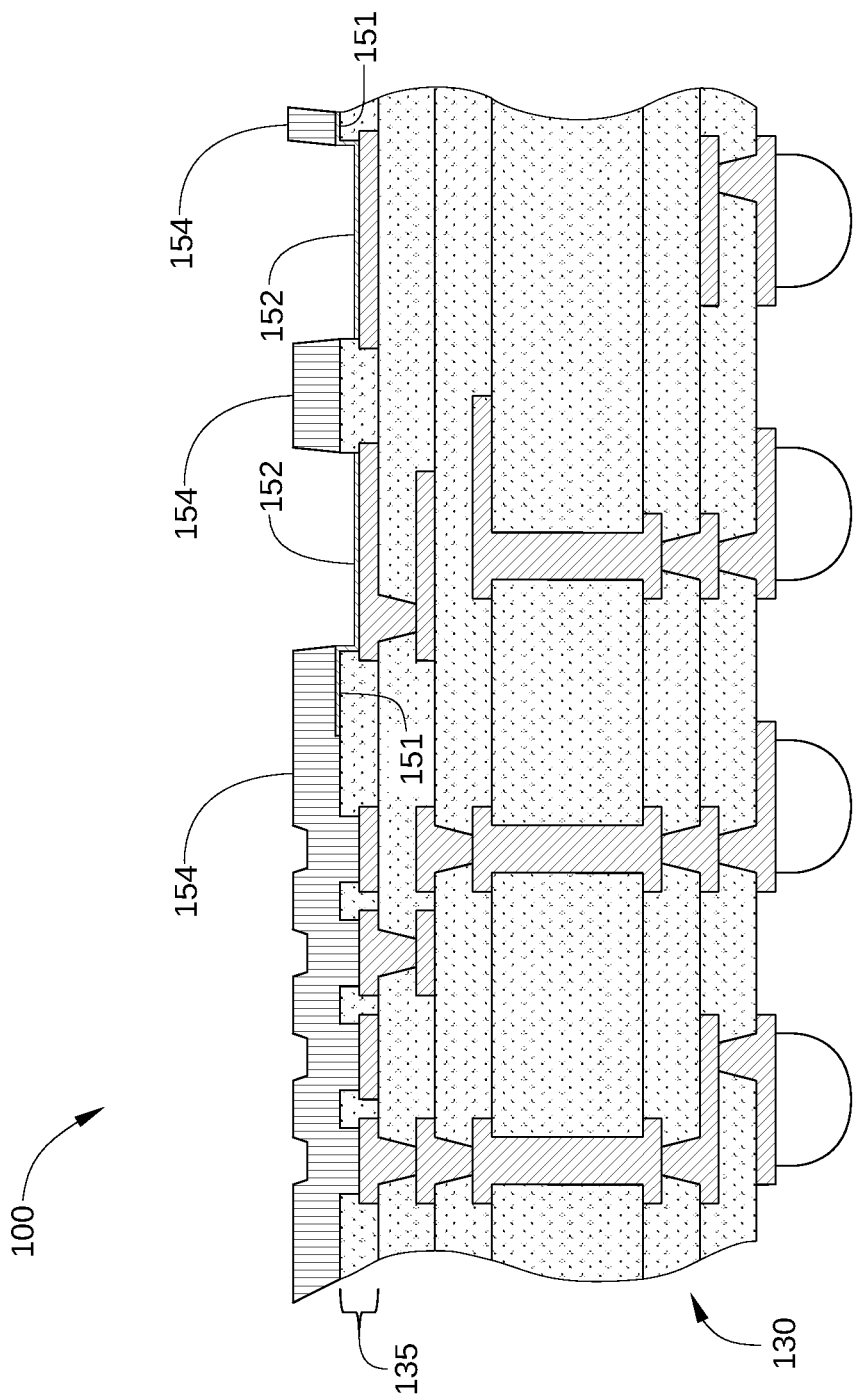

In step 203, a mask layer 154 is deposited or otherwise formed on packaging substrate 130 to cover plating tails 151 while leaving plating pads 152 exposed, as shown in FIG. 3D. For example, in some embodiments, mask layer 154 may include a photoresist layer. In such embodiments, the photoresist layer may be deposited as a blanket film that covers the exposed surface of packaging substrate 130, including plating tails 151, plating pads 152, and dielectric layer 135. Portions of the deposited photoresist layer are then selectively exposed to an energy source, such as a frequency of visible or ultra-violet light that breaks down the photoresist material, so that the portions of mask layer 154 that correspond to plating pads 152 are removed and the remainder portion of mask layer 154 remains. In this way, plating tails 151 and other features of packaging substrate 130 are covered by mask layer 154 while plating pads 152 are left exposed.

Figure 3E:
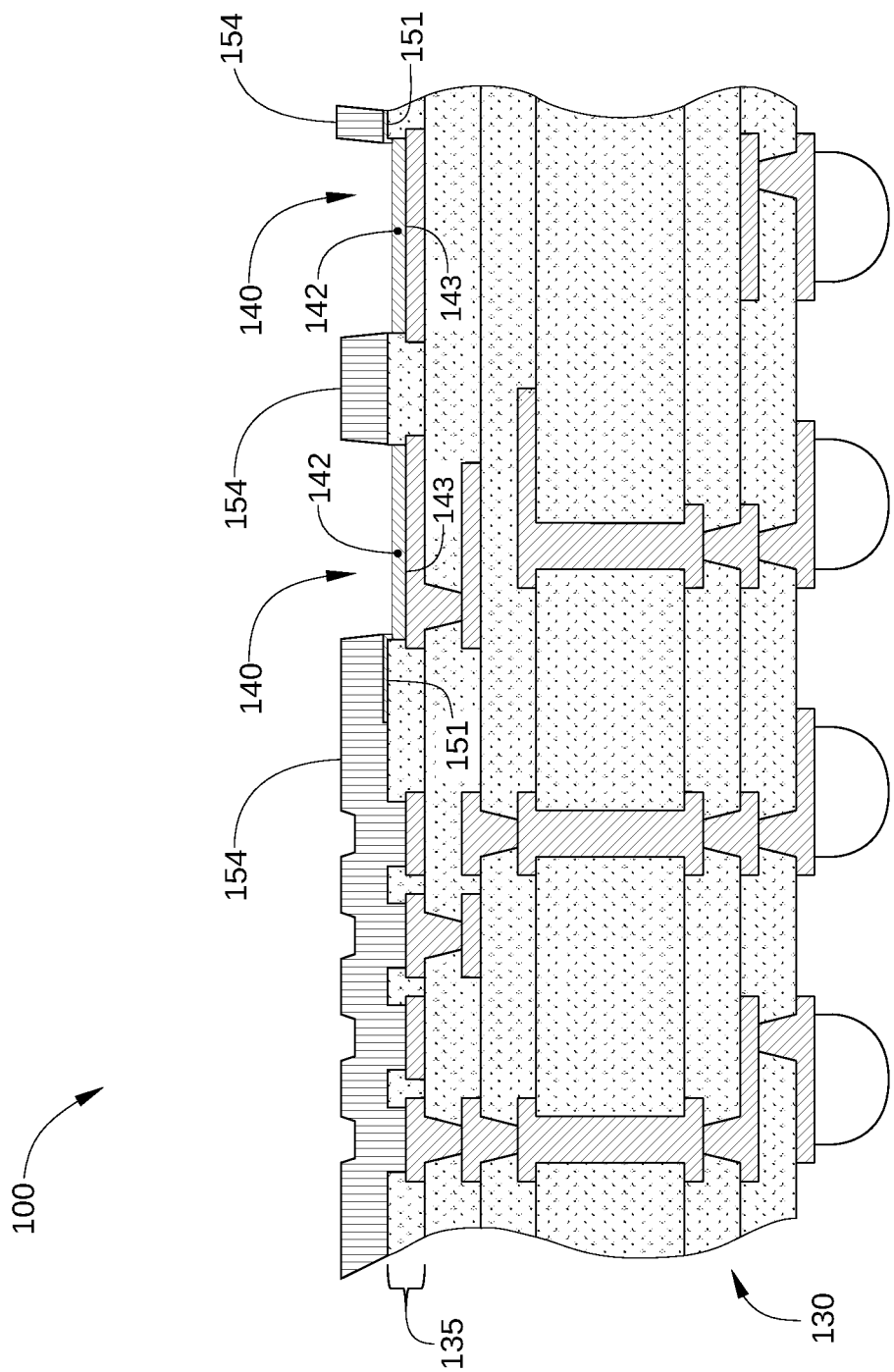

In step 204, an electro-plating process is performed on packaging substrate 130 to deposit an electroplated surface finish layer 142 on plating pads 152, as shown in FIG. 3E. Plating pads 152 are disposed on surface 143, but for clarity are omitted in FIG. 3E. Because plating tails 151 are covered by mask layer 154, electroplated surface finish layer 142 is not formed on plating tails 151. Electroplated surface layer 142 includes one or more electrically conductive materials that are substantially inert with respect to oxygen, and can be used to prevent the oxidation of surface 143 on each electrical connection pad 140. Suitable materials for electroplated surface finish layer 142 include an organic solderability preservative (OSP) material, a nickel-gold (Ni—Au) material, a nickel-silver (Ni—Ag) material, a nickel-platinum (Ni—Pt) material, a nickel-containing material, a gold-containing material, and a platinum-containing material, among others. In some embodiments, electroplated surface finish layer 142 is formed with a thickness of about 0.5 to about 10 microns. For example, in one embodiment, electroplated surface finish layer 142 includes a nickel-gold alloy, and may be deposited to a thickness of about 1 to about 8 microns. The electrolyte used in step 204 is selected so that surface finish layer 142 includes a desired material that is substantially inert with respect to oxygen.

Figure 3F:
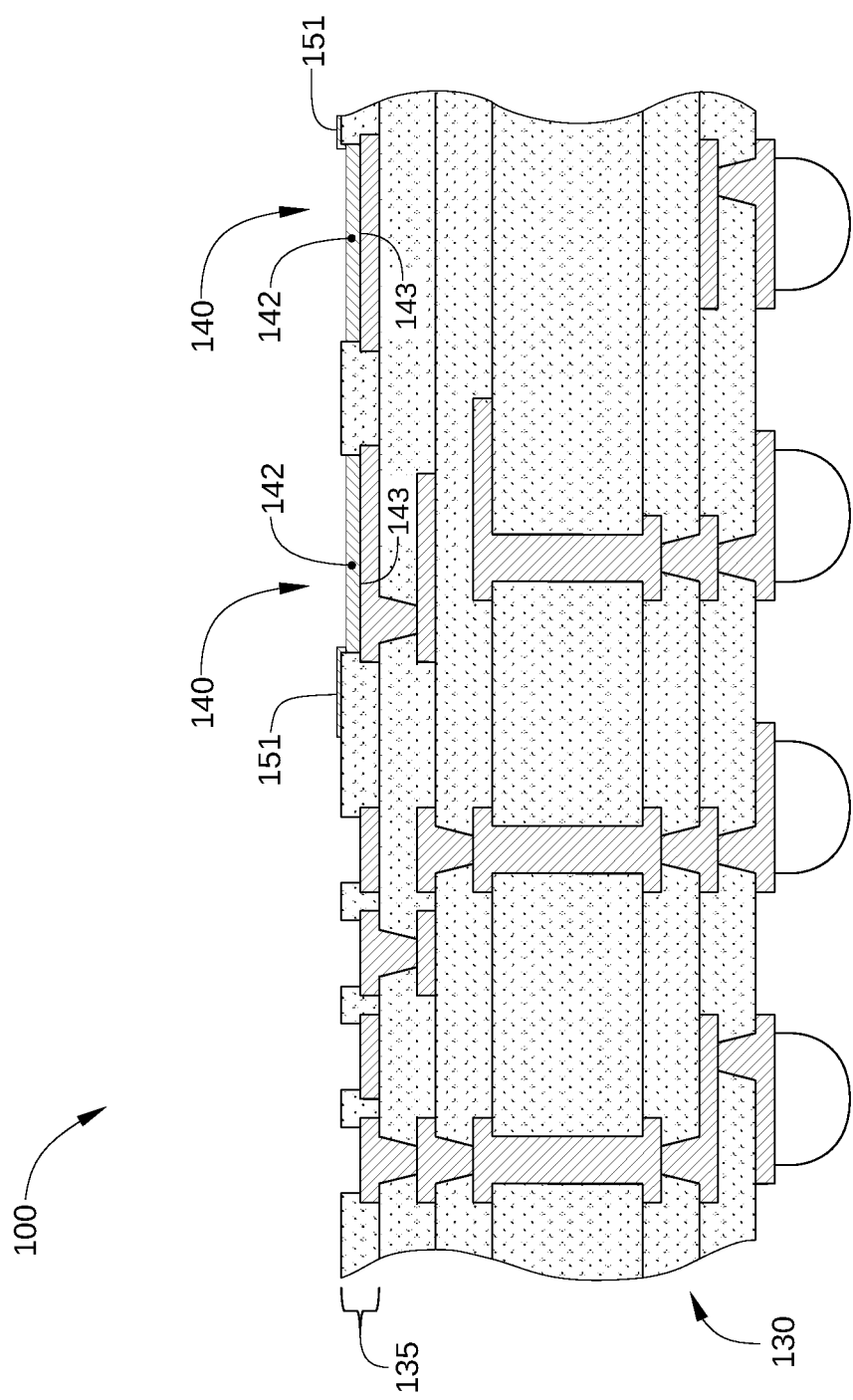

In step 205, mask layer 154 is removed using any technically feasible mask removal process, as shown in FIG. 3F. For example, when mask layer 154 includes a photoresist material, such as a dry film mask, exposure of mask layer 154 to ultra-violet light is generally sufficient for removal of mask layer 154. After step 205, plating tails 151 are no longer covered by mask layer 154 and can be removed.

Figure 3G:
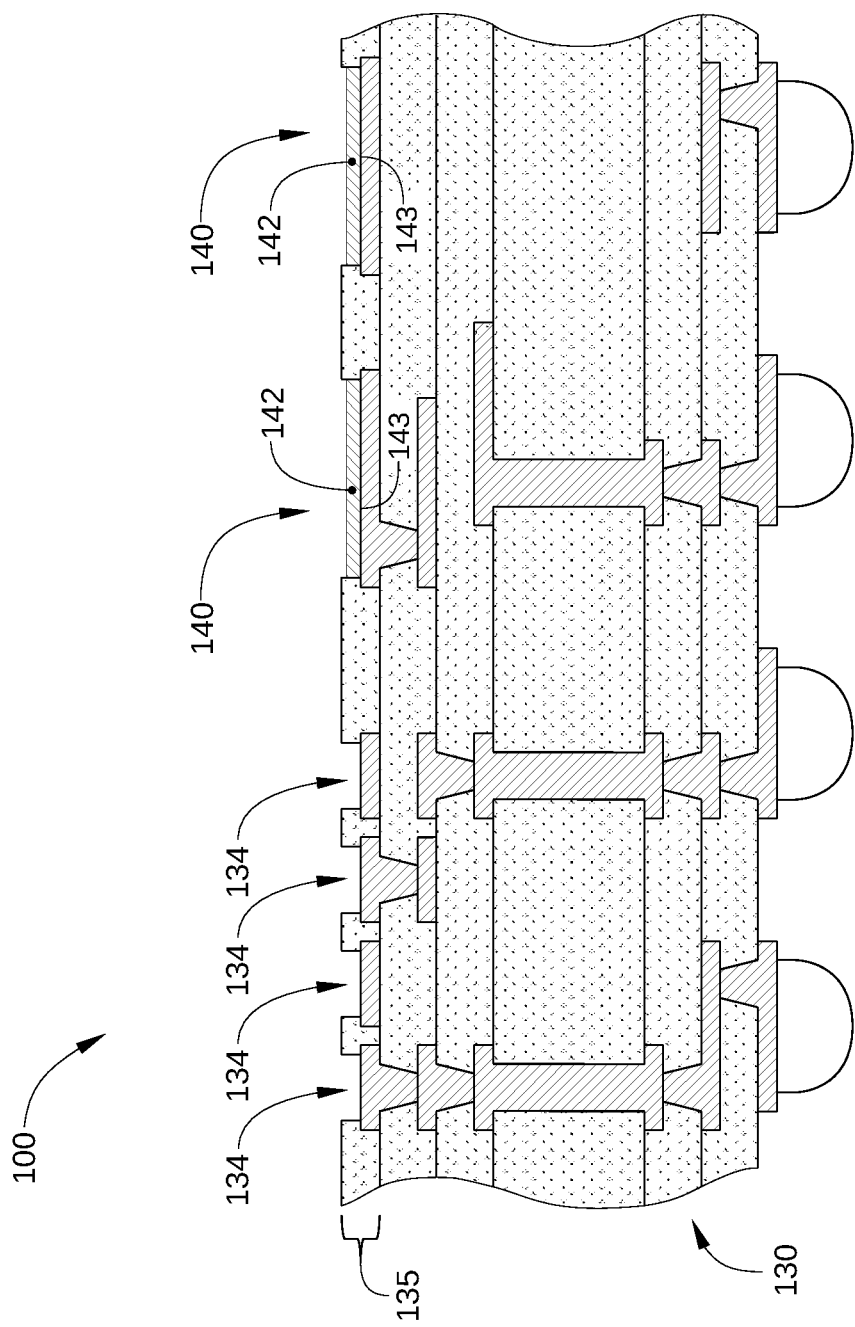

In step 206, plating tails 151 are removed from packaging substrate 130 using any technically feasible metal etch process, as shown in FIG. 3G. In some embodiments, plating tails 151 are removed by exposing packaging substrate 130 to a suitable wet etching solution, which is a simple and easily controlled process that does not require masking and patterning steps. Because plating tails 151 and electroplated surface finish layer 142 may both be exposed to a wet etching solution in step 206, in such embodiments a wet etching solution may be used that is more reactive with one or more materials included in plating tails 151 than with materials included in electroplated surface finish layer 142. Because electroplated surface finish layer 142 is selected to be a relatively inert material with respect to oxygen, a variety of etching solutions may be used to remove plating tails 151 without significantly affecting electroplated surface finish layer 142. For example, in embodiments in which plaiting tails 151 include copper or a copper alloy, because copper readily reacts with oxygen, suitable wet etching solutions for removing plating tails 151 without significantly affecting electroplated surface finish layer 142 include $HNO_3$ solutions, solution of $NH_4OH$ and $H_2O_2$, solutions of $HNO_3$ and $H_2O_2$, solutions of $NH_3$ and $H_2O_2$, solutions of $H_3PO_4$, $HNO_3$, and $CH_3COOH$, solutions of $HNO_3$, $H_2SO_4$, $CrO_3$, and $NH_4Cl$, and solutions of $HCL$ and $FeCl_3$. In some embodiments, one or more combinations of the above solutions may be used for removing plating tails 151.

It is noted that, for ease of fabrication, in some embodiments, plating tails 151 and electrical connection pads 134 may include similar materials, for example copper. Consequently, when packaging substrate 130 is exposed to the wet etching solution in step 206, electrical connection pads 134 may also be etched. However, because plating tails 151 may be formed from a relatively thin layer of conductive material compared to the thickness of electrical connection pads 134, the removal of a small portion of electrical connection pads 134 has substantially no effect on the performance of packaging substrate 130 or on IC package 100.

After the completion of step 206, one or more IC chips, such as IC chip 101, can be coupled to electrical connection pads 134 using standard IC package assembly techniques. Similarly, one or more chip packages, such as second IC package 120, can be coupled to electrical connection pads 140 to complete the assembly of IC package 100.

Figure 5:
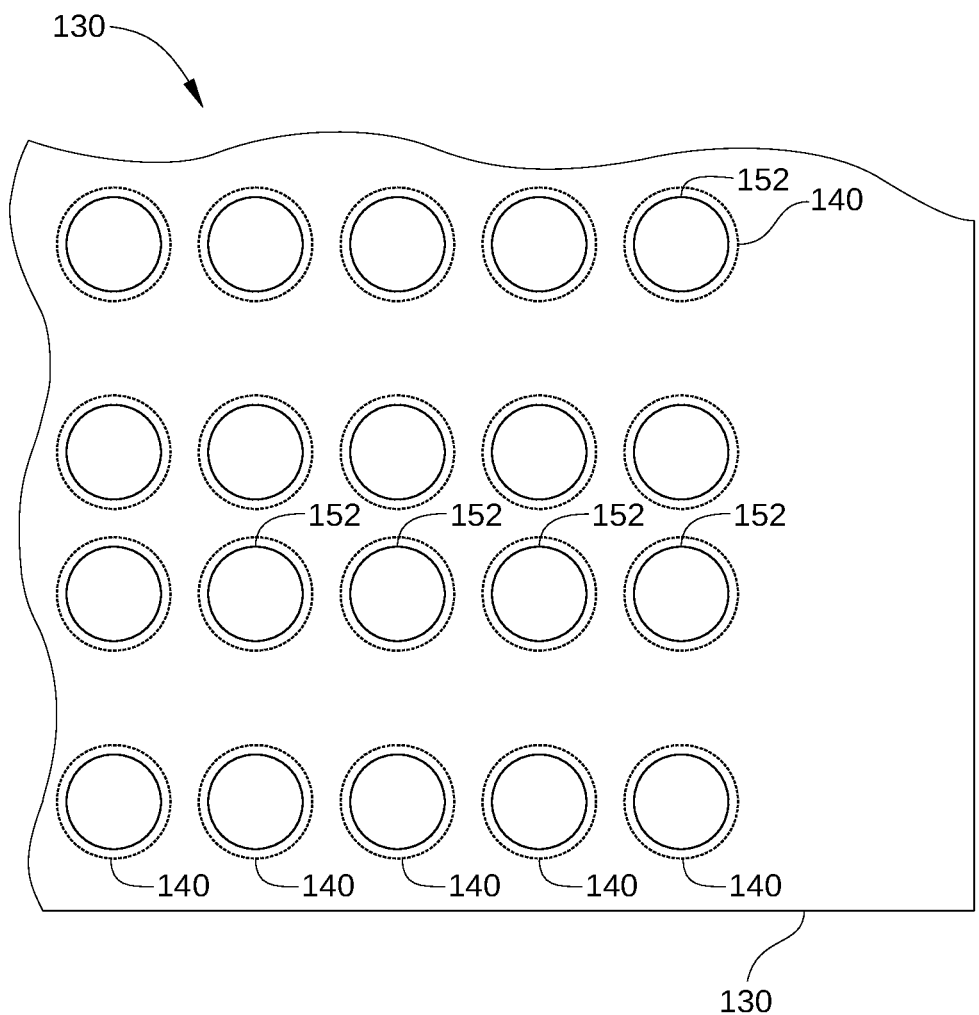
FIG. 5 is a partial plan view of a packaging substrate after plating tails are removed from the packaging substrate, according to one embodiment of the present invention.

FIG. 5 is a partial plan view of packaging substrate 130 after plating tails 151 are removed from packaging substrate 130, according to one embodiment of the present invention. As shown, after step 206 of method 200, plating pads 152 are no longer in electrical communication with conductive paths or traces, thereby eliminating this source of signal degradation. Because electrical connection pads 140 are each covered by electroplated surface finish layer 142 (shown in FIGS. 3E-3G), a robust solder joint can be formed at each of electrical connection pad 140 with second IC package, even IC package 100 undergoes multiple reflow operations. For example, such solder joints may be less susceptible to cracking during manufacture or use and may also have reduced electrical resistance.

Figure 6:
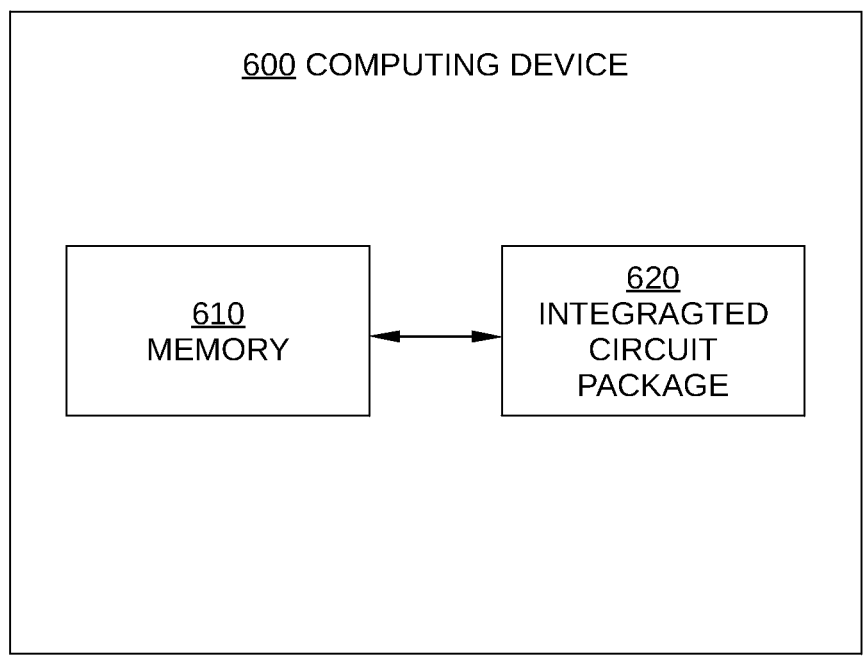
FIG. 6 illustrates a computing device in which one or more embodiments of the present invention can be implemented.

FIG. 6 illustrates a computing device in which one or more embodiments of the present invention can be implemented. Specifically, FIG. 6 is a block diagram of a computer system 600 with a IC package 620 configured according to an embodiment of the present invention. As shown, computer system 600 includes a memory 610 and an IC package 620 that is coupled to memory 610. Computer system 600 may be a desktop computer, a laptop computer, a smartphone, a digital tablet, a personal digital assistant, or other technically feasible computing device. Memory 610 may include volatile, non-volatile, and/or removable memory elements, such as random access memory (RAM), read-only memory (ROM), a magnetic or optical hard disk drive, a flash memory drive, and the like. IC package 620 may be substantially similar in organization and operation to IC package 100, described above in conjunction with FIG. 1, and may include a CPU, a GPU, an application processor or other logic device, a system-on-chip, or any other IC chip-containing device.

In sum, embodiments of the present invention set forth an IC package that includes a packaging substrate with electroplated pads that are free of plating tails. One advantage of such embodiments is that signal degradation caused by the presence of plating tails in the IC package is avoided. Furthermore, because in such embodiments the packaging substrate includes an electroplated surface finish layer on electrical connection pads, solder joints formed using these electrical connection pads are advantageously more robust and suitable for use in a PoP configuration.

While the foregoing is directed to embodiments of the present invention, other and further embodiments of the invention may be devised without departing from the basic scope thereof, and the scope thereof is determined by the claims that follow.

I claim:

1. A method for forming an integrated circuit package, the method comprising:

depositing an electrically conductive seed layer on a packaging substrate, wherein the seed layer includes a plating tail portion and a pad portion that is in electrical communication with the plating tail portion;

depositing a mask layer on the packaging substrate to cover the plating tail portion while leaving the pad portion exposed;

after depositing the mask layer, performing an electro-plating process on the packaging substrate to deposit a metallic layer on the pad portion; and after performing the electro-plating process, removing the mask layer and the plating tail portion.

2. The method of claim 1, wherein removing the plating tail portion comprises exposing the plating tail portion and the metallic layer to a wet etching solution.

3. The method of claim 2, wherein the wet etching solution is more reactive with a material included in the plating tail portion than with a material included in the metallic layer.

4. The method of claim 2, wherein the electrically conductive seed layer comprises a copper-containing material.

5. The method of claim 4, wherein the wet etching solution comprises at least one of an $HNO_3$ solution, a solution of $NH_4OH$ and $H_2O_2$, a solution of $HNO_3$ and $H_2O_2$, a solution of $NH_3$ and $H_2O_2$, a solution of $H_3PO_4$, $HNO_3$, and $CH_3COOH$, a solution of $HNO_3$, $H_2SO_4$, $CrO_3$, and $NH_4Cl$, and a solution of HCL and $FeCl_3$.

6. The method of claim 2, further comprising, prior to depositing the electrically conductive seed layer, forming an electrical connection pad on the package substrate.

7. The method of claim 6, wherein removing the plating tail portion further comprises exposing the electrical connection pad to a wet etching solution, wherein the electrical connection pad does not include an electroplated surface finish layer.

8. The method of claim 7, wherein the wet etching solution is more reactive with a material included in the electrical connection pad than with a material included in the metallic layer.

9. The method of claim 1, wherein performing an electro-plating process on the packaging substrate comprises electrically coupling the plating tail portion to an electrode.

10. The method of claim 1, wherein depositing a mask layer on the packaging substrate comprises depositing a photoresist layer on the packaging substrate and selectively exposing portions of the photoresist layer to an energy source.

* * * * *